US009020781B2

(12) United States Patent
Lieberman et al.

(10) Patent No.: US 9,020,781 B2
(45) Date of Patent: Apr. 28, 2015

(54) MONITORING MEMORY MODULE PARAMETERS IN HIGH PERFORMANCE COMPUTERS

(75) Inventors: Donald A. Lieberman, San Jose, CA (US); Daniel R. Solvin, Fremont, CA (US)

(73) Assignee: Corsair Memory, Inc., Fremont, CA (US)

( * ) Notice: Subject to any disclaimer, the term of this patent is extended or adjusted under 35 U.S.C. 154(b) by 314 days.

(21) Appl. No.: 12/764,051

(22) Filed: Apr. 20, 2010

(65) Prior Publication Data
US 2011/0144951 A1 Jun. 16, 2011

Related U.S. Application Data

(63) Continuation-in-part of application No. 12/636,673, filed on Dec. 11, 2009.

(51) Int. Cl.
*G06F 11/30* (2006.01)
*G06F 11/34* (2006.01)
*G11C 29/56* (2006.01)
*G11C 5/04* (2006.01)
*G11C 29/04* (2006.01)

(52) U.S. Cl.
CPC ............ *G06F 11/348* (2013.01); *G06F 11/349* (2013.01); *G06F 2201/81* (2013.01); *G11C 5/04* (2013.01); *G11C 29/56* (2013.01); *G11C 2029/0409* (2013.01)

(58) Field of Classification Search
USPC ................ 702/57, 64, 65, 74, 118, 120, 130, 702/182–185, 188, 193; 330/282; 327/89; 374/162, 166
See application file for complete search history.

(56) References Cited

U.S. PATENT DOCUMENTS

| 6,480,946 | B1 | 11/2002 | Tomishima et al. |
| 6,930,554 | B2 * | 8/2005 | Mondal et al. ................ 330/282 |
| 2004/0007326 | A1 * | 1/2004 | Roche et al. ............. 156/345.24 |
| 2006/0045168 | A1 * | 3/2006 | Socci et al. .................... 374/163 |
| 2006/0239095 | A1 | 10/2006 | Shi et al. |
| 2007/0047378 | A1 | 3/2007 | Wolford et al. |
| 2007/0211548 | A1 | 9/2007 | Jain et al. |
| 2008/0267258 | A1 * | 10/2008 | Hokenmaier ................. 374/166 |
| 2009/0024790 | A1 | 1/2009 | Rajan et al. |

OTHER PUBLICATIONS

PCT/US11/33082, PCT International Search Report dated Jul. 20, 2011.
PCT/US11/33082, PCT Written Opinion of the International Search Authority dated Jul. 20, 2011.

* cited by examiner

*Primary Examiner* — Mohamed Charioui
(74) *Attorney, Agent, or Firm* — Sheppard, Mullin, Richter & Hampton LLP

(57) ABSTRACT

Monitoring parameters of memory modules is described. According to certain embodiments, one or more parameters on respective memory modules are monitored. Corresponding parameter information is transmitted from the respective memory module to a device that is external to the respective memory modules.

20 Claims, 7 Drawing Sheets

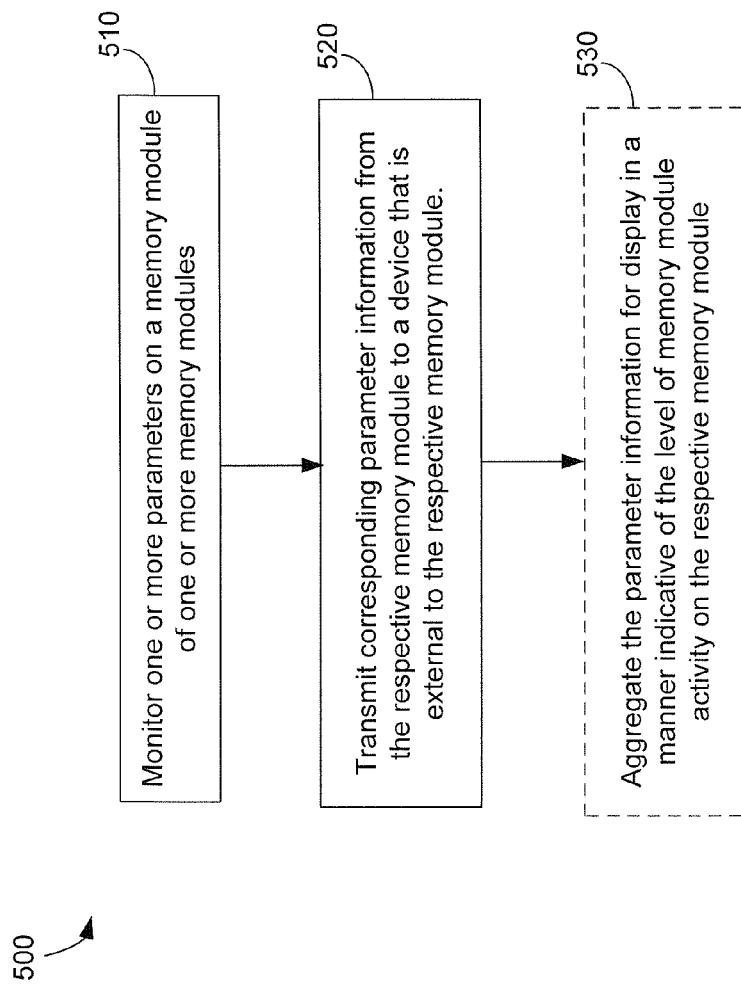

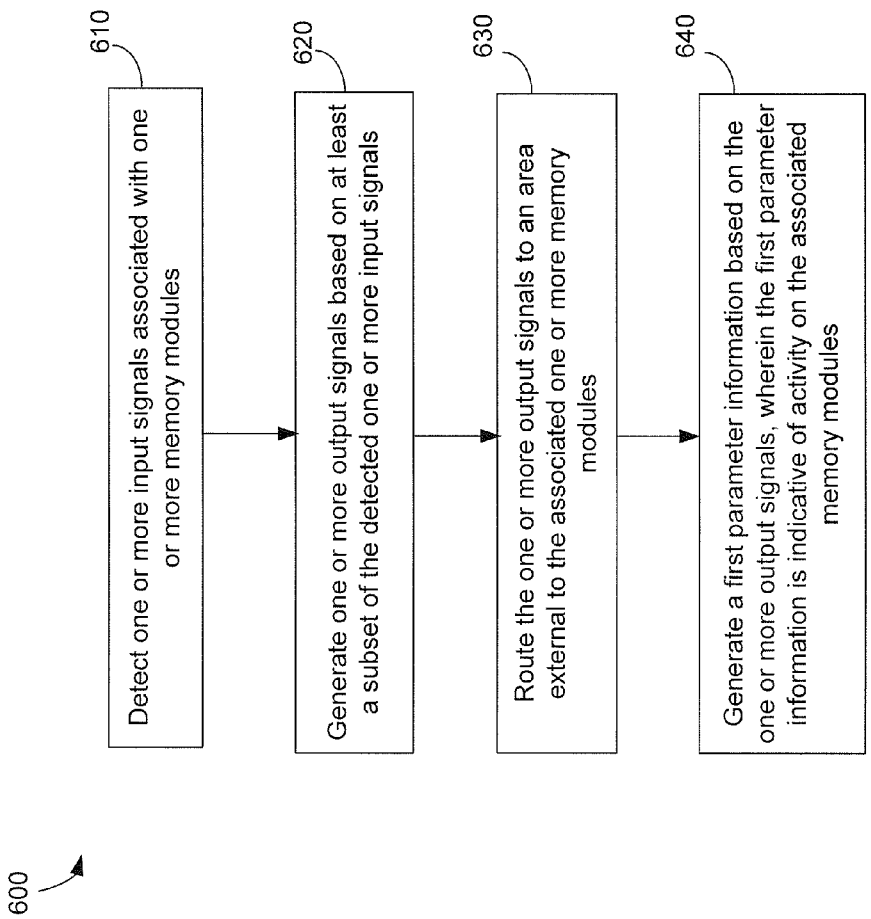

MONITORING MEMORY MODULE PARAMETERS IN HIGH PERFORMANCE COMPUTERS

CROSS-REFERENCE TO RELATED APPLICATIONS

The present application is a Continuation of and claims priority to U.S. patent application Ser. No. 12/636,673 filed Dec. 11, 2009, the disclosure of which is incorporated herein by reference.

TECHNICAL FIELD

The present invention is directed to the use of memory modules, and more specifically to the monitoring of memory modules.

BACKGROUND

Individual assembly of one's own personal computers may be achieved by purchasing and assembling motherboards, power supplies, video cards, disk drives, memory modules and other components, to which a keyboard, display monitor, and mouse may be connected. In such an assembly, many of the computer's internal operating parameters may be monitored. Monitoring such parameters can be especially important to the builders of high performance systems where such parameters are used to optimize overall system performance. One such parameter to monitor is the activity of one or more memory modules which represents how much use a particular memory module is experiencing in various computing tasks. Other parameters include the temperature or the power supply voltage of the memory module. Indicators can be placed on the printed circuit board of each memory module to monitor such parameters of the memory module. However, there is often limited room on the circuit board, and the cost of adding one or more of these indicators to each memory module along with the associated display electronics can be prohibitive.

In view of the foregoing, there is a need for a cost-effective device, system and method for remotely monitoring memory module parameters.

BRIEF DESCRIPTION OF THE DRAWINGS

FIG. 5 is flow diagrams illustrating the operation of monitoring (detector) systems of FIGS. 2A and 2B, according to other embodiments. [2B]

FIG. 6 is a flow diagram illustrating the operation of monitoring (detector) systems of FIGS. 2A and 2B, and the monitoring unit of FIG. 1 according to some other embodiments.

Figure 1:
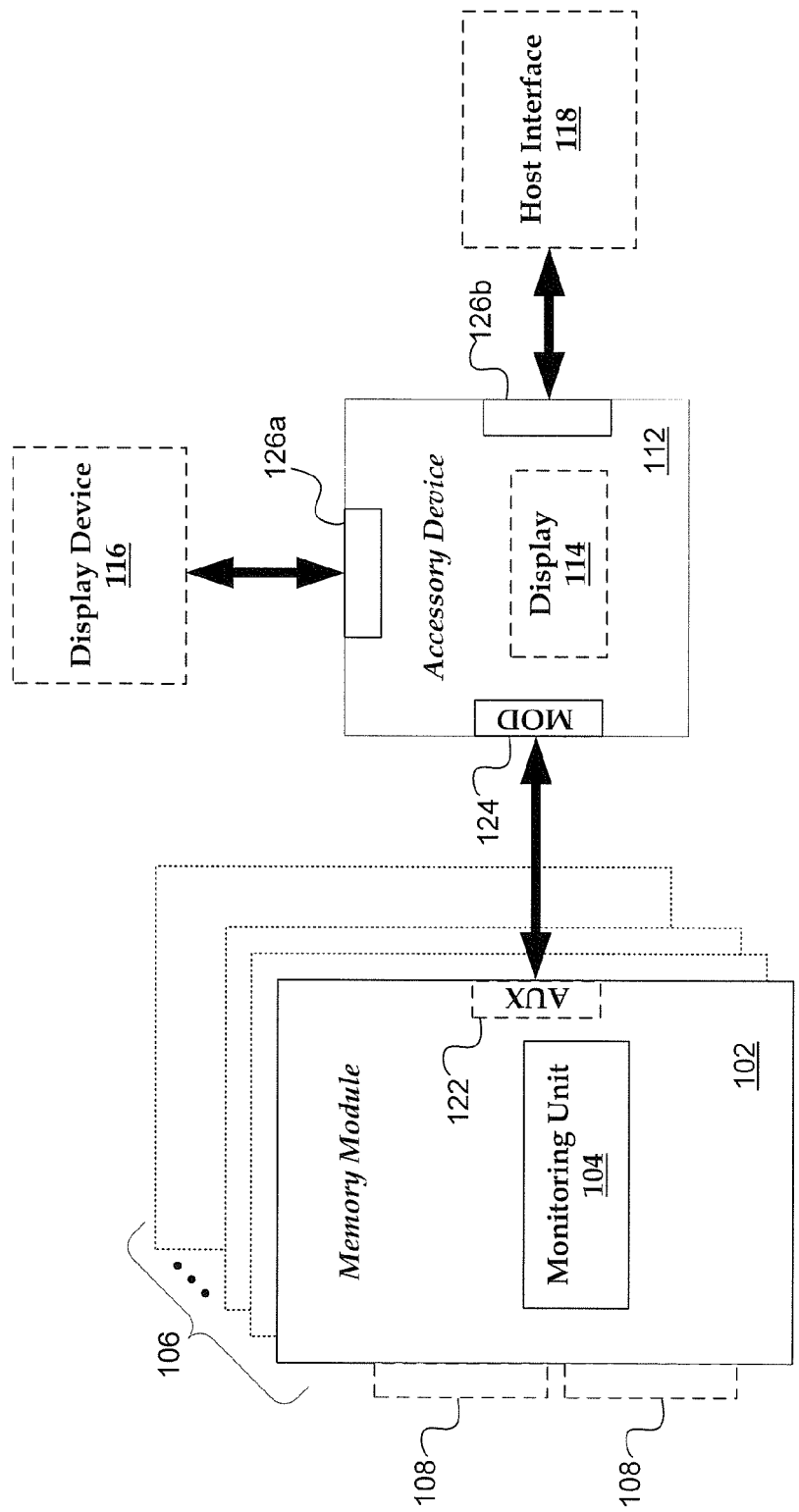
FIG. 1 is high-level block diagram illustrating a connection between a memory module, housing a monitoring unit, and an external accessory device, according to certain embodiments.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Reference will now be made in detail to embodiments, examples of which are illustrated in the accompanying drawings. In the following detailed description, numerous specific details are set forth in order to provide a sufficient understanding of the subject matter presented herein. But it will be apparent to one of ordinary skill in the art that the subject matter may be practiced without these specific details. Moreover, the particular embodiments described herein are provided by way of example and should not be used to limit the scope of the invention to these particular embodiments. In other instances, well-known methods, procedures, components, and circuits have not been described in detail so as not to unnecessarily obscure aspects of the embodiments.

According to some embodiments, one or more parameters on one or more memory modules are monitored, and the corresponding parameter information is transmitted from each of respective memory modules that are being monitored to a device that is external to the respective memory modules. In some embodiments, the parameter information may be aggregated for display in a manner indicative of the level of memory activity on the memory module.

According to certain embodiments, one or more input signals associated with one or more memory modules are detected. One or more output signals are generated based on the detected input signals. According to certain embodiments, the output signals are routed to an area external to the associated one or more memory modules. Parameter information may be generated based on the one or more output signals. Such parameter information is indicative of activity on the associated one or more memory modules.

According to some embodiments, memory activity can be measured by counting the assertions of the high frequency Chip Select ($\overline{CS}$) signals during the execution of various applications. The rate at which the chip select signals are asserted can be converted to a visual display. Colored indicators can be lit to represent greater memory module activity, for example. According to certain embodiments, the indicators can be implemented using an accessory circuit and associated display electronics that is remote from the memory module that is being monitored. Utilizing an accessory circuit that is remote from the memory module will not only result in valuable savings in real estate on the memory module but will also result in considerable cost savings as explained herein.

According to certain embodiments, the chip select input signals ($\overline{CS}$) on a given memory module can be detected and inverted or buffered. Corresponding output signals (CS, $\overline{CS}_{buff}$) are generated in response to at least a subset of the received chip select input signals ($\overline{CS}$), wherein the output signals form at least a subset of the parameter information. According to certain embodiments, the output signals can be routed to a connector on the given memory module for transmission over a cable to an accessory module that is remote from the given memory module. According to certain other embodiments, the chip select input signals ($\overline{CS}$) may be received off the given memory module rather than on the given memory module, and the output signals may be generated off the memory module and routed accordingly.

According to certain embodiments, an emitter follower can be configured as a buffer on a given memory module for detecting the chip select input signals ($\overline{CS}$). In some embodiments, a device is housed in a memory module of one or more memory modules having a power supply, ground potential, and at least one connector node. At least one transistor may be coupled between the power supply and ground potential, wherein the first transistor has an output coupled to the at least one connector node. The first transistor may be configured as the emitter follower, and is operable to receive a chip select signal of the memory module and output a buffered chip select signal to at least one connector node. In some embodiments, the at least one connector node is configured to route the buffered chip select signal off the memory module.

According to some embodiments, a detector system associated with one or more memory modules includes at least one detector component, such as a comparator or buffer. The at least one detector component comprises a first input node for receiving at least one chip select input signal of one or more chip select input signals detected from the one or more memory modules. An output node of the at least one detector component is configured to provide one or more chip select output signals based on at least a subset of the received input signals and to route the one or more chip select output signals off the one or more memory modules.

FIG. 1 is high-level block diagram illustrating a connection between a memory module 102, housing a monitoring unit 104, and an external aggregating accessory unit or computing device, such as accessory device 112, which may comprise a display component 114, according to some embodiments. The memory module 102 may be any memory module known in the art, including but not limited to Dual in-line package memory, Single In-line Pin Package memory (SIPP), Single Inline Memory Module (SIMM), Dual Inline Memory Module (DIMM), Small outline DIMM (SO-DIMM), and so on; or any other packaging or assembly of memory devices DRAM, SRAM, Flash, and so on. In some embodiments, the memory module 102 includes connectors 108 that allow the memory module 102 to be connected to a motherboard of a larger computer system. In some embodiments, the connection between the memory module 102 and the accessory device 112 is provided via an auxiliary connector 122 on the memory module 102 and a memory module connector 124 (MOD) on the accessory device 112.

The monitoring unit 104 comprises a simple, inexpensive circuit that can be included in the memory module 102 with little impact to the overall real estate of the circuit board. In some embodiments, the monitoring unit 104 may be located external to the memory module 102. The monitoring unit 104 allows for detecting memory module activity and other parameters, such as changes in temperature or the supply voltage level of the memory module 102. The monitoring unit 104 may be configured to transmit the detected parameter information over a connection to the accessory device 112 at auxiliary connector 122. In some embodiments, the parameter information is transmitted wirelessly from the memory module 102 to the accessory device 112. In some embodiments, a system may include a plurality of memory modules 106. Each monitoring unit 104 may be placed on each of the plurality of memory modules 106 or on a subset of the plurality of memory modules 106. According to certain embodiments, the accessory device 112 may aggregate the parameter information from at least a subset of the plurality of memory modules 106 for display. Alternatively, the accessory device 112 may have a connection port 126b to connect to the motherboard of the computer wherein software running on the computer may display the information to the system user.

In some embodiments, the accessory device 112 may be connected to the single memory module 112 or to the plurality of memory modules 106 or to a subset thereof. Each of the plurality of memory modules 106 may include its own auxiliary connector 122, or, in other embodiments, may locally communicate to a designated main memory module, such as memory module 102, when interfacing with accessory device 112. Alternatively, the plurality of memory modules 106 may be connected to two or more accessory devices (not shown).

The monitoring unit 104 includes a circuit for the remote monitoring of activity in a corresponding memory module 102. Memory module activity may be measured by counting the number of assertions of the high frequency Chip Select ($\overline{CS}$) signals during the execution of various applications that use the memory module. In some embodiments, there may be more than one chip select signal for each memory module 102. Each chip select signal may represent the activity of a portion of the memory module. For example, in a typical 16-chip memory module (512 MB), there are two chip select signals for each DRAM memory module having 16 chip parts. Thus, each chip select signal represents the activity of half of the DRAM memory module.

In some embodiments, the monitoring unit 104 may also include a thermocouple, thermistor or other devices for measuring the temperature of the module. In some embodiments, the monitoring unit 104 may also include a connection to the supply voltage provided to the memory module.

The accessory device 112 may be a display device or may include a display component 114. The accessory device 112 is separate from the memory module 102, and may be configured to connect to the memory module 102 via auxiliary connector 122, as previously described. The accessory device 112 may be connected to the memory module 102 at any time since, unlike the memory module 102, it is not required for computer operation. The display component 114 may include one or more colored indicators that respond to received chip select signals from the monitoring unit 104 to represent the level of memory module activity of a corresponding memory module. For example, activity on the memory module 102 may be displayed as a multicolored bar graph, that utilizes light-emitting diodes to indicate the level of activity on the memory module 102. Activity on a plurality of memory modules 106 may also be organized and displayed as a multicolored bar graph, where each bar in the graph represents a memory module 102 or groups of memory modules 106.

In addition, the display component 114 may include indicators for showing temperature information and power supply information. Indicators displayed for such other parameters may be indicated by a numerical value or by a color indicator. For example, the temperature information may be displayed as a temperature in degrees. Alternatively, the temperature information may be displayed by a colored light source, such as an RGB-LED, that displays a color from a range of colors representing a range of temperatures.

In some embodiments, the accessory device 112 may be configured to connect to a separate display device 116 via connector 126a. Connector 126a can be any type of connector known in the art, including but not limited to an Inter-Integrated Circuit (I2C) connector.

In some embodiments, the accessory device 112 may include a microprocessor (not shown), analog-to-digital converters (not shown) or other circuitry to measure the parameters present on the connections to the memory modules 102. Such measurements could then be displayed on digital readout devices present on the accessory device 112 (i.e., display component 114), displayed on a digital readout device separate from the accessory device 112 (i.e., display device 116)

or communicated to a computer via a standard interface such as host interface 118. The host interface 118 may be connected to the accessory device 112 via any standard connection 126b known in the art, (e.g., Universal Serial Bus). In other embodiments, the accessory device 112 is a computing device, such as a computer, coupled to receive parameter measurements directly from the memory modules 102 via a host interface (not shown) or any standard connection known in the art.

Figure 2A:
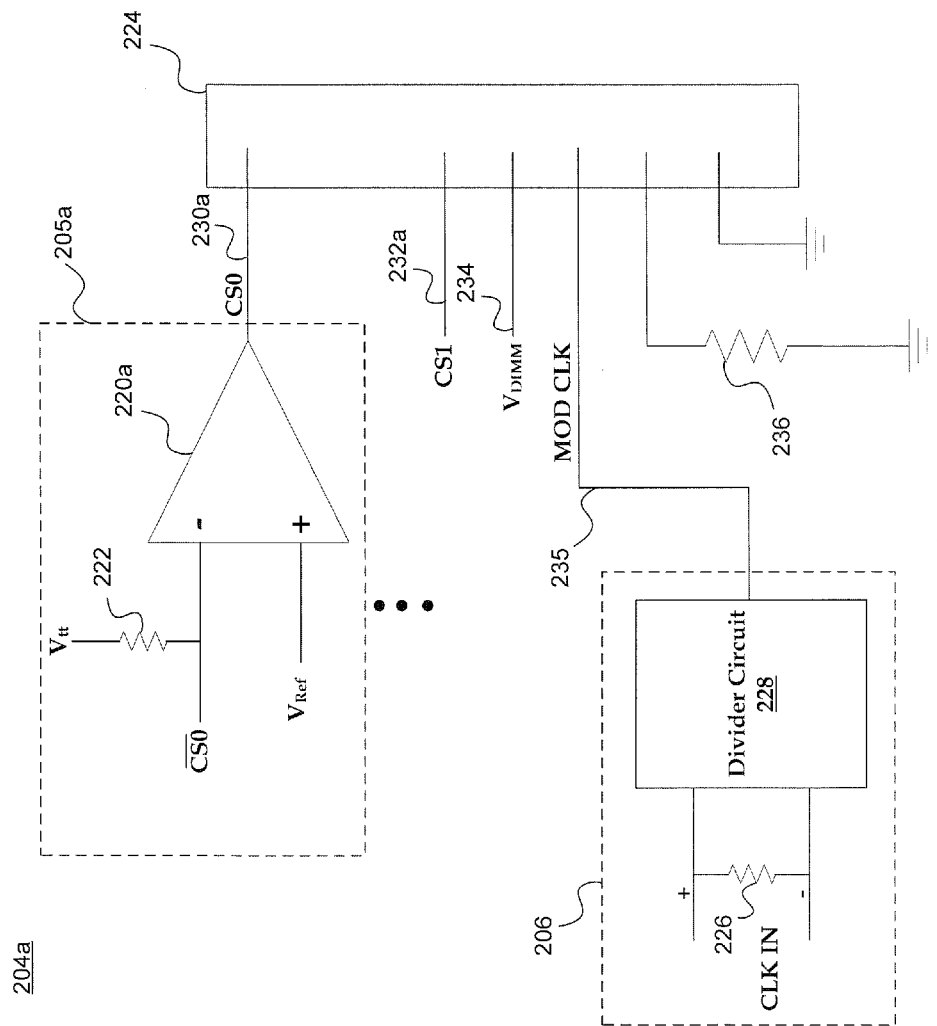
FIGS. 2A and 2B are high-level schematics illustrating various embodiments of a detector (inverting comparator or buffer) utilized in the monitoring unit of the memory module in FIG. 1, according to certain embodiments.
Figure 2B:
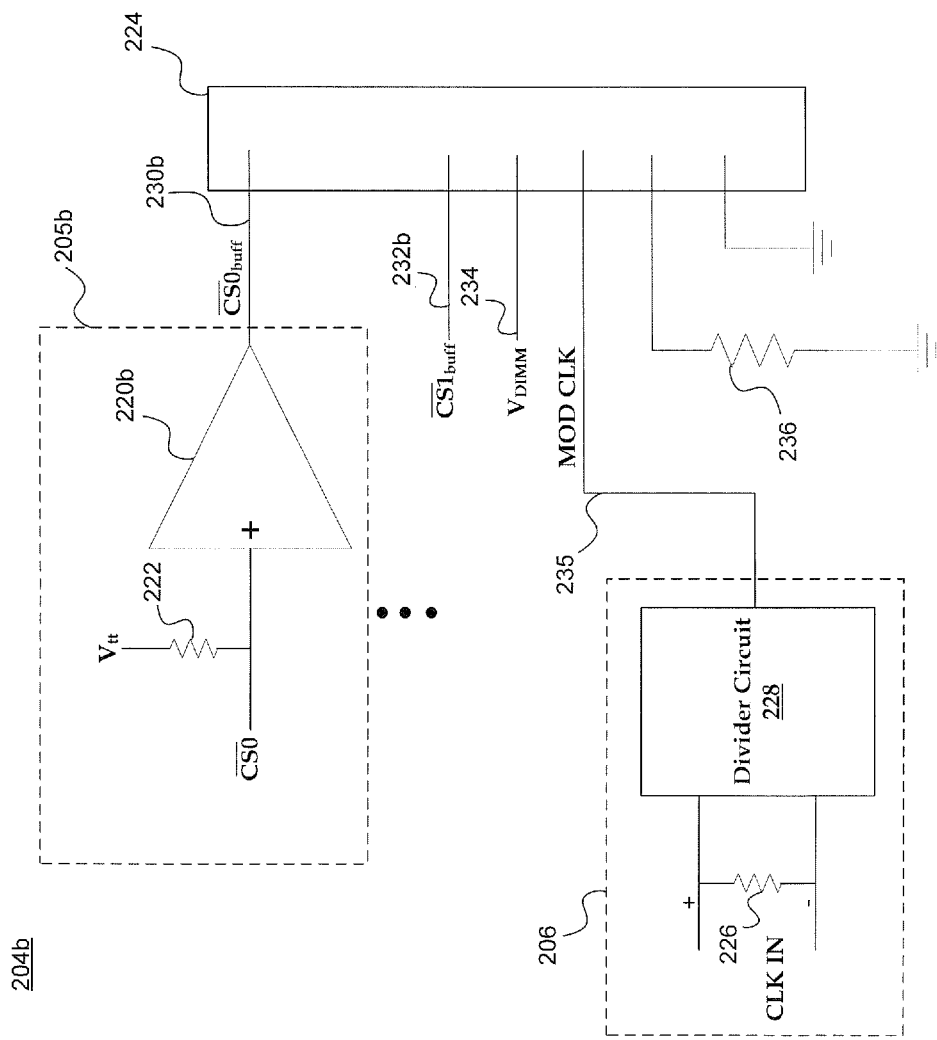

FIGS. 2A and 2B are high-level schematics illustrating monitoring systems 204a, 204b that may be utilized in the monitoring unit 104 of FIG. 1, according to certain embodiments. In some embodiments, the monitoring system 204a includes an inverting comparator 220a, which is a high speed inverting comparator that may be used to buffer and invert the chip select signal $\overline{CS0}$ to output an inverted signal CS0. The chip select signal $\overline{CS0}$ may represent the activity of a portion of the memory module 102, as described in previous sections. It will be appreciated that each memory module 102 may include a plurality of chip select signals $\overline{CS0}$, $\overline{CS1}$, $\overline{CS2}$ . . . , and so on, corresponding to size or the number of chips on the memory module 102. For example, in a 16-chip memory module, there may be two chip select signals $\overline{CS0}$ and $\overline{CS1}$, where $\overline{CS0}$ services a first portion (8 chips) and $\overline{CS1}$ services a second portion (8 chips) of the memory module 102.

A first comparator circuit 205a may be included in the memory module 102 to output a first inverted output signal CS0 at output port 230a and routed to connector 224. In some embodiments, a second comparator circuit (not shown) may be included in the memory module 102 to output a second inverted output signal CS1 at output port 232a (in response to receiving a second chip select signal $\overline{CS1}$), and also routed to connector 224. In some embodiments, the monitoring circuit 204a may include N number of comparator circuits similar to comparator circuit 205a, where N≥2. The N comparators (not shown) may be configured to route output signals to connector 224. In other embodiments, the monitoring circuit 204a may include more than one connector 224 to which signals in the monitoring circuit 204a may be routed. In other embodiments, the comparator circuit 205a, or combination of comparators and/or connectors, may be configured off the memory module 102.

The comparator 220a receives the chip select $\overline{CS0}$ signal as one of its input signals. In some embodiments comparator 220a is a single chip high speed comparator. It will be appreciated that other configurations for inverting the chip select $\overline{CS0}$ signal, as known in the art, may be utilized in place of the comparator circuit 205a. A resistor 222 is additionally coupled between the $\overline{CS0}$ input signal of the comparator 220a and a power supply to terminate the signal in its characteristic impedance at the input and avoid signal reflection. A reference voltage $V_{Ref}$ is received as its second input, and is used as the threshold for the comparison. In some embodiments, the reference voltage $V_{Ref}$ may be generated by voltage divider. The output signal CS0 of monitoring system 204a is routed to a connector 224 for transmission off the module 102. It will be appreciated that additional comparator circuits (not shown) would be configured in a similar manner. In some embodiments, the output signals of the additional comparator circuits may be routed to the same connector 224.

FIG. 2B depicts a high-level schematic illustrating a non-inverting buffer circuit 205b that may be utilized in the monitoring unit 104 of FIG. 1, according to certain embodiments. In some embodiments, the buffer circuit 205b in monitoring system 204b may be an alternative to inverting comparator circuit 205a in the monitoring system 204a. The monitoring system 204b includes some of the same components as the monitoring system 204a (FIG. 2A) the operation of which will not be discussed again in detail in the interest of brevity. The non-inverting buffer circuit 205b includes non-inverting buffer 220b, which is a high speed buffer for chip select signal $\overline{CS0}$. The chip select signal $\overline{CS0}$ may represent the activity of a portion of the memory module 102, as described in previous sections. It will be appreciated that each memory module 102 may include a plurality of chip select signals $\overline{CS0}$, $\overline{CS1}$, $\overline{CS2}$ . . . , and so on, corresponding to size or the number of chips on the memory module 102. For example, in a 16-chip memory module, there may be two chip select signals $\overline{CS0}$ and $\overline{CS1}$, where $\overline{CS0}$ services a first portion (8 chips) and $\overline{CS1}$ services a second portion (8 chips) of the memory module 102. In response to receiving the chip select signal $\overline{CS0}$ the buffer circuit 205b outputs a first buffered output signal $\overline{CS0}_{buff}$ at output port 230b and routes the buffered output signal $\overline{CS0}_{buff}$ to connector 224.

In some embodiments, the non-inverting buffer 220b receives the chip select $\overline{CS0}$ signal as its only input signal. A resistor 222 is additionally coupled between the $\overline{CS0}$ input signal of the non-inverting buffer 220b and a power supply to terminate the signal in its characteristic impedance at the input and avoid signal reflection. The output signal $\overline{CS0}_{buff}$ of non-inverting buffer 205b is routed to a connector 224 for transmission off the module 102.

It will be appreciated that additional non-inverting buffer circuits (not shown) may be configured in a similar manner. In some embodiments, a second non-inverting buffer circuit (not shown) may be included in the monitoring system 204b to output a second output signal $\overline{CS1}_{buff}$ at output port 232b (in response to receiving a second chip select signal $\overline{CS1}$), and also routed to connector 224. In some embodiments, the output signals of the additional buffer circuits may be routed to the same connector 224. Similar to monitoring circuit 204a, in some embodiments, the monitoring circuit 204b may include N number of buffer circuits similar to buffer circuit 205b, where N≥2. In some embodiments, the monitoring circuit 204b may include more than one connector 224 to which signals in the monitoring circuit 204b may be routed. As in the monitoring system 204a, in other embodiments, the buffer circuit 205b, or combination of buffers and/or connectors in the monitoring system 204b, may be configured off the memory module 102.

The connector 224 of FIGS. 2A and 2B may include additional interconnections to circuitry of the memory module 102. It will be appreciated that other configurations as known in the art, such as multiple connectors, may be utilized in the various embodiments described. In some embodiments, the connector 224 may be connected to a temperature measuring device, such as thermistor 236, for measuring the temperature of the memory module 102. Temperature information may be routed off the module 102 via the connector 224 to be processed or to monitor the temperature externally from the memory module 102. In some embodiments, the connector 224 may include a connection 234 to the power supply $V_{DIMM}$ of the memory module 102 so that the memory module voltage may also be monitored externally.

In some embodiments, the connector 224 may be connected to an output port 235 configured to receive a clock signal MOD CLK from the memory module 102. Receiving the clock signal MOD CLK at connector 224 illustrates remote monitoring of one or more clock signals on the memory module 102. For example, in the case of DRAM on a DIMM module, the connector 224 may receive a DIMM Module Clock signal as the MOD CLK signal, which can be transmitted off the memory module 102 to be monitored remotely such as by accessory device 112. In some embodiments, a divider circuit 228 may be included in the monitoring unit 104 and utilized to divide a differential clock signal CLK IN generated in the memory module 102 to reduce the frequency of the clock signal when it is received by the connector 224. The differential clock signal CLK IN may be terminated by termination resistor 226 at the input port of the divider circuit 228 to prevent signal reflections. The divider circuit 228 may be any circuit known in the art to convert the output to a desired or more useful frequency, such as a binary divider (e.g., ripple counter) or other types of counters. For example, if an existing clock generator on the memory module 102 provides a differential clock signal in the 1-2 GHz range, and the divider circuit 228 is a binary divider that divides the clock signal, the clock signal can be divided to a range of 10-20 MHz. The lower frequency is received by the connector 224 to transmit off module.

Upon receiving the various parameter information, connector 224 may transmit the parameter information or a subset of the parameter information off module to the accessory device 112 or any other device that may utilize, process or display the parameter information. In some embodiments, the transmission of the parameter information from the connector 224 to the accessory device 112 is over a hardwire or cable. In some embodiments, the parameter information is transmitted wirelessly from the connector 224.

Figure 3:
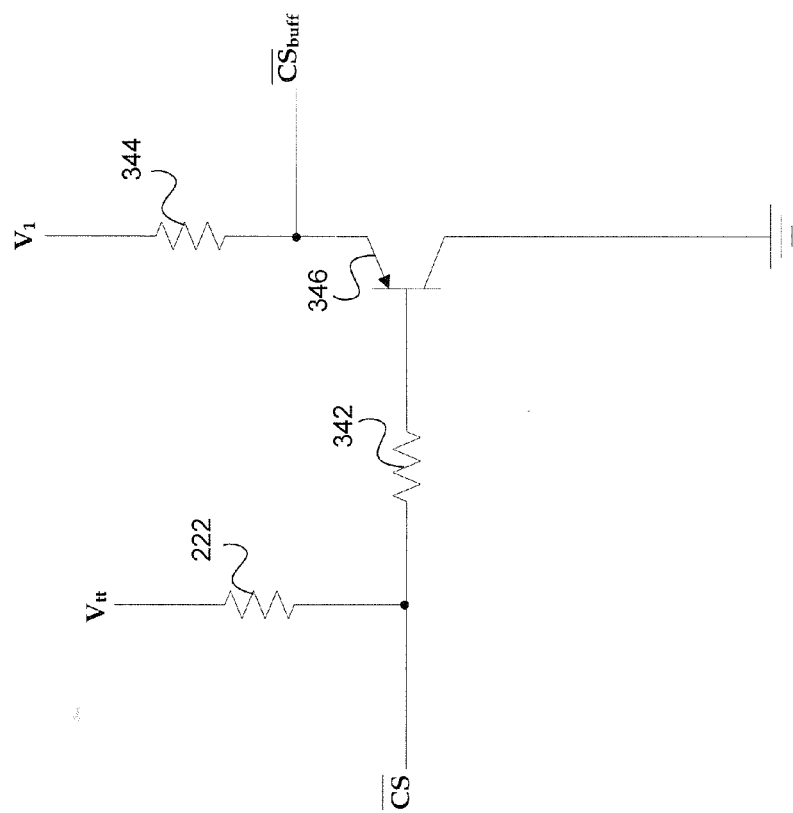
FIG. 3 is a schematic illustrating a non-inverting buffer monitoring circuit in a memory module of FIG. 1, according to certain embodiments.

FIG. 3 is a detailed schematic illustrating a buffer circuit 305 in memory module 102 of FIG. 1 capable of generating a buffered non-inverted signal $\overline{CS}_{buff}$ relative to the chip select signal $\overline{CS}$, according to certain embodiments. The incoming $\overline{CS}$ signal is coupled through resistor 342 to the base of PNP transistor 346 which is configured as an emitter follower. The collector of transistor 346 is tied to ground and the emitter is coupled through resistor 344 to power supply $V_1$. Resistor 342 serves to isolate the $\overline{CS}$ signal from the parasitic capacitance of transistor 346 thus maintaining signal integrity. Since transistor 346 is configured as an emitter follower, the signal that appears at the emitter is in non-inverted form, except for an offset by $+V_{BE}$ (approximately 0.6 to 0.7 volts) and a slight time delay. Furthermore, since the input impedance of a transistor emitter follower configuration is very high and the output impedance is very low, the transistor 346 acts as a buffer. Thus buffer circuit 305 acts as a non-inverting buffer. As in FIG. 2, the $\overline{CS}$ signal is additionally coupled to a second power supply potential $V_{tt}$ via resistor 222 to prevent signal reflections.

Additionally, the emitter follower configuration, coupled with careful selection of the transistor 346, allows for achieving frequencies in excess of 1 GHz. The implementation of the buffer circuit 305 costs only a few cents so as not to greatly increase the overall cost of the memory module 102. It will be appreciated that buffer circuit 305 may be achieved by other configurations as known in the art, and may include additional circuitry not shown. In some embodiments, the buffer circuit 305 may include N number of transistors, where N≥2. The N transistors may be configured similarly to transistor 346 such that the N transistors receive N number of $\overline{CS}$ signal and outputs N number of $\overline{CS}_{buff}$ signals.

Figure 4:
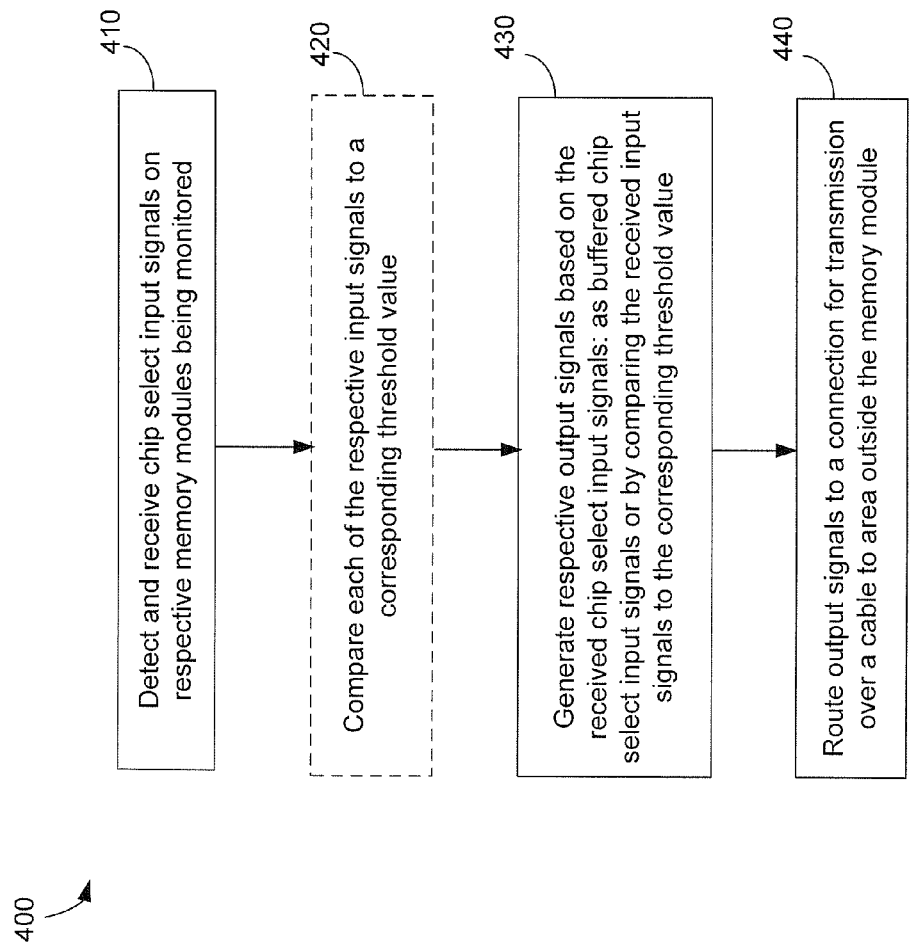
FIG. 4 is a flow diagram illustrating the operation of monitoring (detector) systems of FIGS. 2A, 2B, and the buffer circuit of FIG. 3, according to certain embodiments.

FIG. 4 is a flow diagram illustrating the operation of the monitoring systems 204a, 204b of FIGS. 2A and 2B, and the buffer circuit 305 of FIG. 3, according to certain embodiments. At 410, one or more chip select input signals are detected and received. Optionally in some embodiments, at 420, the received input signals are compared to a threshold value. According to certain embodiments, the threshold value is programmable. At 430, respective output signals are generated based on the received chip select input signals: as buffered chip select input signals or by comparing the received input signals to the corresponding threshold value based on the comparison performed at 420. In some embodiments, at 440, the output signal is routed to a connection for transmission over a cable to area outside the memory module.

FIG. 5 is a flow diagram illustrating the operation of the monitoring systems 204a, 204b of FIGS. 2A and 2B, according to other embodiments. At 510, one or more parameters on a memory module of one or more memory modules are monitored. At step 520, corresponding parameter information is transmitted away from the respective memory module to a device that is external to the respective memory module. Optionally, at step 530, the parameter information may be aggregated for display in a manner indicative of the level of memory module activity on the respective memory module.

FIG. 6 is a flow diagram illustrating the operation of the monitoring systems 204a and 204b of FIGS. 2A and 2B, and of the monitoring unit 104 of FIG. 1, according to some other embodiments. At 610, one or more input signals associated with one or more memory modules are detected. At step 620, one or more output signals are generated based on at least a subset of the detected one or more input signals. At step 630, the one or more output signals are routed to an area external to the associated one or more memory modules. In some embodiments, at 640 a first parameter information based on the one or more output signals is generated, wherein the first parameter information is indicative of activity on the associated one or more memory modules.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method comprising:
   detecting one or more input signals associated with one or more memory modules by using a differential pair of transistors configuration housed on a respective memory module of the one or more memory modules, the differential pair of transistors configuration being coupled between a power supply and ground potential and coupled to an output node;
   generating, by using the differential pair of transistors configuration, one or more output signals based on at least a subset of the detected one or more input signals;
   using a voltage divider coupled to a base of a second transistor of the differential pair and operable to provide as a reference signal a programmable reference voltage between zero and an operating voltage of the respective memory module, and a first transistor of the differential pair coupled to the power supply;
   using a first resistor configurable to be coupled to the base of the second transistor and the voltage divider;
   using a second resistor configurable to be coupled to the base of the second transistor, and further coupled to a preselected reference voltage, wherein the first resistor is installed when the programmable reference voltage is applied; and wherein the second resistor is installed when the preselected reference voltage is applied;
   routing the one or more output signals to an area external to the associated one or more memory modules; and generating a first parameter information based on the one or more output signals, wherein the first parameter information is indicative of activity on the associated one or more memory modules, and wherein the area external to the associated one or more memory modules is only for enabling display of the first parameter information.

2. The method of claim 1, wherein the one or more input signals comprise one or more chip select signals of the associated one or more memory modules.

3. The method of claim 1, wherein generating the one or more output signals based on the at least a subset of the one or more input signals comprises generating one or more buffered chip select signals.

4. The method of claim 1, wherein the one or more output signals are buffered by a transistor configured as an emitter follower.

5. The method of claim 1, further comprising comparing the one or more input signals to a threshold value, and generating one or more inverted output signals based on the comparison.

6. The method of claim 1, further comprising:
detecting a subset of other signals corresponding to N parameter information of the associated one or more memory modules;
generating at least a subset of N parameter information based on the subset of the other signals, wherein the N parameter information includes: temperature measurement data, a memory module clock signal, and power supply information for the one or more memory modules; and
displaying the at least a subset of N parameter information.

7. The method of claim 1, further comprising displaying the first parameter information associated with the one or more memory modules on at least one accessory device.

8. The method of claim 1, wherein generating the one or more output signals is achieved off the one or more memory modules.

9. The method of claim 1, further comprising:
aggregating the first parameter information from a subset of the one or more memory modules; and
displaying the aggregated first parameter information of the subset of the one or more memory modules.

10. The method of claim 1, wherein routing the one or more output signals to an area external to the associated one or more memory modules comprises routing the one or more output signals wirelessly.

11. A device associated with one or more memory modules comprising:
a power supply and ground potential;
at least one connector node; and
at least one differential pair of transistors coupled between the power supply and ground potential, the at least one differential pair of transistors having an output coupled to the at least one connector node,
wherein the at least one differential pair of transistors is configured to receive one or more input signals from the one or more memory modules and operable to generate one or more output signals based on at least a subset of the one or more input signals, and to provide the one or more output signals to the at least one connector node, and
wherein the at least one connector node is configured to route the one or more output signals off the one or more memory modules for display purposes only;
a voltage divider coupled to a base of a second transistor of the differential pair and operable to provide as a reference signal a programmable reference voltage between zero and an operating voltage of the memory module, and a first transistor of the differential pair coupled to the power supply;
a first resistor configurable to be coupled to the base of the second transistor and the voltage divider; and
a second resistor configurable to be coupled to the base of the second transistor, and further coupled to a preselected reference voltage, wherein the first resistor is installed when the programmable reference voltage is applied, and wherein the second resistor is installed when the preselected reference voltage is applied.

12. The device of claim 11, wherein the one or more input signals correspond to size or number of chips on the one or more memory modules.

13. The device of claim 11, further comprising a plurality of connector nodes for receiving a subset of the one or more output signals.

14. The device of claim 13, further comprising at least one accessory device coupled to at least a subset of the plurality of connector nodes, the at least one accessory device configured to receive the one or more output signals at the at least a subset of the plurality of connector nodes, and operable to display a representation of the received one or more output signals.

15. The device of claim 11, further comprising at least one of:
a temperature measuring device coupled to the at least one connector node, the temperature measuring device being operable to measure the temperature of the one or more memory modules; and
a clock divider circuit coupled to the at least one connector node, the clock divider circuit being operable to divide a received memory module clock signal.

16. The device of claim 11, further comprising at least one accessory device coupled to the at least one connector node, the at least one accessory device being configured to receive information including at least a subset of: temperature measurement data, the one or more output signals, a memory module clock signal, and power supply information from the one or more modules.

17. The device of claim 16, wherein the accessory device is a computing device associated with the one or more memory modules via at least one host interface.

18. The device of claim 16, further comprising a display device coupled to the at least one accessory device, and configured to display a representation of the information received by the at least one accessory device.

19. The device of claim 16, further comprising at least one computing device associated with the at least one accessory device via at least one host interface, the at least one computing device operable to process at least a subset of: temperature measurement data, the one or more output signals, a memory module clock signal, and power supply information of the one or more modules.

20. The device of claim 11, wherein the at least one differential pair of transistors comprises an emitter follower.

* * * * *